United States Patent
Song et al.

(10) Patent No.: US 7,582,945 B2
(45) Date of Patent: Sep. 1, 2009

(54) PHOTO THIN FILM TRANSISTOR HAVING PHOTOCONDUCTIVE LAYER INCLUDING CHALCOGENIDE ELEMENT AND UNIT CELL OF IMAGE SENSOR USING THE SAME

(75) Inventors: Ki Bong Song, Daejeon (KR); Doo Hee Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 168 days.

(21) Appl. No.: 11/481,599

(22) Filed: Jul. 6, 2006

(65) Prior Publication Data

US 2007/0096242 A1     May 3, 2007

(30) Foreign Application Priority Data

Oct. 31, 2005   (KR) .................. 10-2005-0103427
Dec. 15, 2005   (KR) .................. 10-2005-0124174

(51) Int. Cl.
H01L 31/06 (2006.01)
(52) U.S. Cl. .................. 257/462; 257/E31.052; 257/E31.082
(58) Field of Classification Search ................ 257/462, 257/E31.052, E31.082
See application file for complete search history.

(56) References Cited

U.S. PATENT DOCUMENTS

| 3,585,071 | A * | 6/1971 | Koelmans .................. 438/158 |
| 6,844,564 | B2 * | 1/2005 | Tanaka et al. .................. 257/3 |
| 2005/0009229 | A1 | 1/2005 | Mitzi |
| 2005/0018526 | A1 * | 1/2005 | Lee .................. 365/232 |

(Continued)

FOREIGN PATENT DOCUMENTS

JP    6088462    *    5/1985

(Continued)

OTHER PUBLICATIONS

Ki-Bong Song, Duhee Cho, Byeong-Ki Cheong, Won-Mok Kim, Tack-Seong Lee, Jun-Ho Kim Feasibility for photo-thin film transistor using chalcogenide alloys, amorphous GeTe-Sb2Te3, Oct. 30-Nov. 2, 2005, 11th Microoptics Conference (Moc'05), Korea Institute of science and Technology, Electronics and Telecommunications Research Institute, pp. 1-2.*

(Continued)

*Primary Examiner*—Wai-Sing Louie
*Assistant Examiner*—Bilkis Jahan
(74) *Attorney, Agent, or Firm*—Ladas & Parry LLP

(57) ABSTRACT

A photo thin film transistor having a photoconductive layer including a chalcogenide element and a unit cell of an image sensor using the same are provided. The photo thin film transistor includes a glass substrate; a photoconductive layer that is formed of GST including a chalcogenide element, is disposed on the glass substrate, and absorbs light and generates an optical current; a source electrode and a drain electrode that are formed on respective sides of the photoconductive layer and form a path for the optical current generated by the photoconductive layer; a gate insulating layer formed on the photoconductive layer; and a gate electrode that is formed on the gate insulating layer and turns the optical current on or off. The photo thin film transistor includes amorphous GST including a chalcogenide element forming a photoconductive layer, thereby providing very high photoconductivity.

4 Claims, 3 Drawing Sheets

U.S. PATENT DOCUMENTS

2005/0056828 A1* 3/2005 Wada et al. .................. 257/40

FOREIGN PATENT DOCUMENTS

KR   10-2004-0110074   12/2004

OTHER PUBLICATIONS

Korean Office Action.

'Proposal for a memory transistor using phase-change and nanosize effects' Hosaka et al., Microelectric Engineering 73-74 (2004) pp. 736-740.

'Rapid-phase transitions of GeTe-$Sb_2Te_3$ pseudobinary amorphous thin films for an optical disk memory' Yamada et al., J. Appl. Phys. 69 (5), Mar. 1, 1991, pp. 2849-2856.

'Feasibility for Photo-Thin Film Transistors Using Chalcogenide Alloys, Amorphous GeTe-$Sb_2Te_3$' Song et al., 11th Microoptics Conference (MOC'05), Tokyo, Japan, Oct. 30-Nov. 2, 2005.

'Photo-TFT using Amorphous GeTe-$Sb_2Te_3$' Photonics Conference 2005, Chungmu Marina Resort, pp. 107-108.

* cited by examiner

PHOTO THIN FILM TRANSISTOR HAVING PHOTOCONDUCTIVE LAYER INCLUDING CHALCOGENIDE ELEMENT AND UNIT CELL OF IMAGE SENSOR USING THE SAME

CROSS-REFERENCE TO RELATED PATENT APPLICATION

This application claims the benefit of Korean Patent Application Nos. 10-2005-0103427, filed on Oct. 31, 2005, 10-2005-0124174, filed on Dec. 15, 2005, in the Korean Intellectual Property Office, the disclosure of which is incorporated herein in its entirety by reference.

BACKGROUND OF THE INVENTION

1. Field of the Invention

The present invention relates to a photo thin film transistor, and more particularly, to a photo thin film transistor having photoconductive characteristics and a unit cell of an image sensor using the same.

2. Description of the Related Art

Generally, the development of information and communication technology has led to technical development such as increases in processing speed and capacity storage. Devices used for information storage include optical information storage devices such as compact discs (CDs) and digital versatile discs (DVDs), and electric memory devices such as dynamic random access memory (DRAM). Examples of devices used in the field of information storage and processing include a photo thin film transistor and a complementary metal oxide semiconductor (CMOS) image sensor. A thin film transistor is generally fabricated using a CMOS process.

FIG. 1 is a cross-sectional view of a photo thin film transistor fabricated using a general CMOS process.

Referring to FIG. 1, an amorphous silicon layer 105 is formed on a silicon substrate 100 doped with impurities. To obtain an ohmic contact, source and drain ohmic contact portions 115 and 110 are formed on respective sides of the amorphous silicon layer 105. The source and drain ohmic contact portions 115 and 110 are formed using an ion implantation process of implanting impurities into part of the amorphous silicon layer 105. The source and drain ohmic contact portions 115 and 110 connect a source electrode 125 and a drain electrode 120 respectively. A gate insulating layer 130 is formed on the amorphous silicon layer 105, the source and drain ohmic contact portions 115 and 110, and the source and drain electrodes 125 and 120. The gate insulating layer 130 is an oxide layer. A gate electrode 135 is formed of metal and disposed on the gate insulating layer 130.

However, the performance of the photo thin film transistor of FIG. 1 is not good because the amorphous silicon layer 105 has low photoconductivity.

Further, when fabricating the photo thin film transistor of FIG. 1 using the CMOS process, a high process temperature of about 500° C. to 1000° C. is required. Furthermore, the photo thin film transistor of FIG. 1 necessarily requires a high-priced silicon substrate and ion implantation process. Thus, the cost of fabricating the thin film transistor of FIG. 1 using the CMOS process is very high.

SUMMARY OF THE INVENTION

The present invention provides a photo thin film transistor having a photoconductive layer including a chalcogenide element having excellent photoconductive efficiency.

The present invention also provides a photo thin film transistor that can be formed without employing a high temperature and high-priced CMOS fabrication processes.

The present invention also provides a unit cell of an image sensor having a photoconductive layer including a chalcogenide element having excellent photoconductive efficiency.

According to an aspect of the present invention, there is provided a photo thin film transistor comprising a glass substrate; a photoconductive layer that is formed of GST including a chalcogenide element, is disposed on the glass substrate, and absorbs light and generates an optical current; a source electrode and a drain electrode that are formed on respective sides of the photoconductive layer and form a path for the optical current generated by the photoconductive layer; a gate insulating layer formed on the photoconductive layer; and a gate electrode that is formed on the gate insulating layer and turns the optical current on or off.

The GST may be formed of amorphous. The gate insulating layer may be an organic poly methyl methcrylate (PMMA) layer. The gate insulating layer may be formed of a chalcogenide insulating layer.

According to another aspect of the present invention, there is provided a unit cell of an image sensor comprising a glass substrate; a photoconductive layer that is formed of GST including a chalcogenide element, is disposed on the glass substrate, and absorbs light and generates an optical current; a source electrode and a drain electrode that are formed on respective sides of the photoconductive layer and form a path for the optical current generated by the photoconductive layer; a gate insulating layer formed on the photoconductive layer; and a gate electrode that is formed on the gate insulating layer and turns the optical current on or off. As described above, the present invention uses the GST layer in an amorphous state including a chalcogenide element as a photoconductive layer, thereby providing very high photoconductivity.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
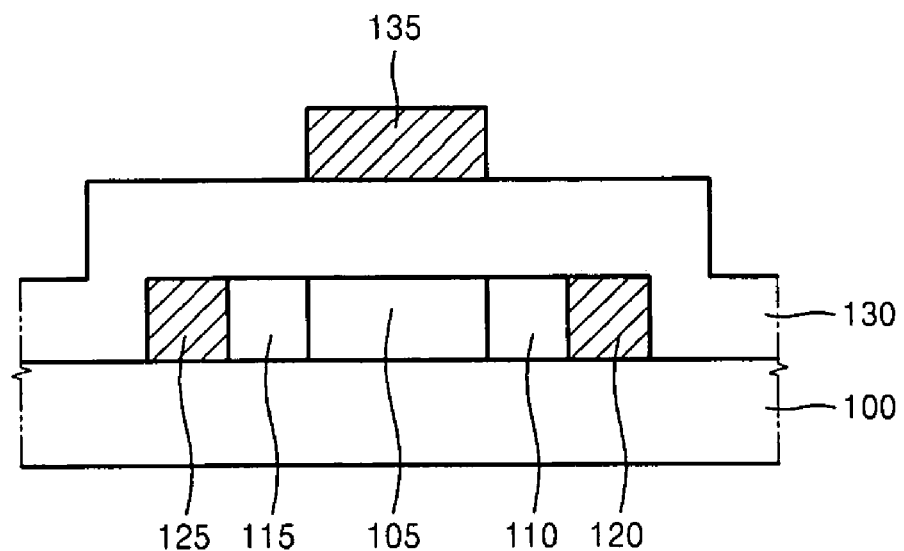
FIG. 1 is a cross-sectional view of a photo thin film transistor fabricated using a general CMOS process.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity.

The inventors of the present invention have found that a material layer including a chalcogenide element, which may be actively used in data storage technology or as a material for a next generation nonvolatile memory device, can be used as a photo-thin film transistor or a photoconductive layer of a unit cell of an image sensor.

The inventors of the present invention have employed a GeTe—$Sb_2Te_3$ layer (hereinafter, referred to as "GST layer") for the material layer including the chalcogenide element, and used that the GST has lone electron pairs in forming a photoconductive layer. The material including the chalcogenide element has been mentioned as an example, but the present invention is not limited thereto. Using specific optical characteristics of the material layer including the chalcogenide element, a unit cell of a photo thin film transistor or a unit cell of image sensor having high efficiency photoconductivity can be formed at low costs and at a low temperature.

Figure 2:
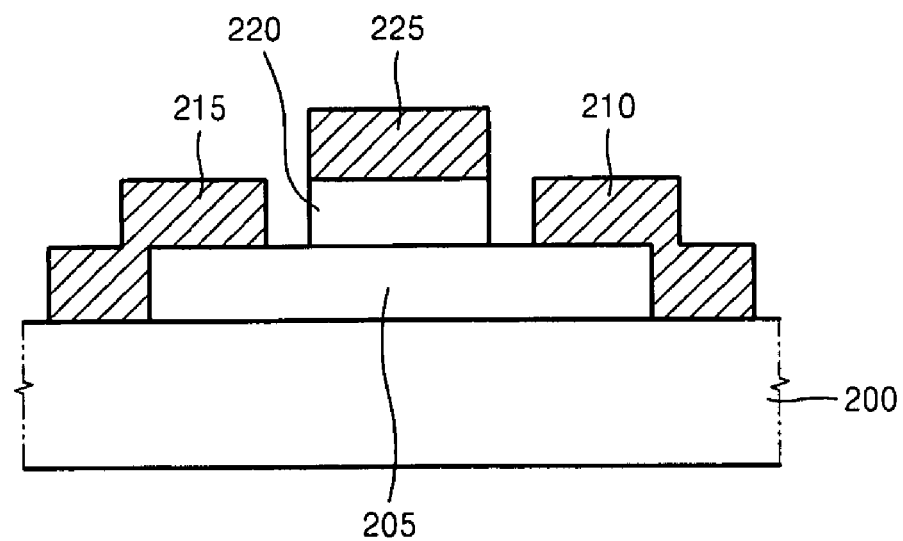
FIG. 2 is a sectional view of a photo thin film transistor and a unit cell of an image censor using the same according to an embodiment of the present invention.

FIG. 2 is a sectional view of a photo thin film transistor and a unit cell of an image censor using the same according to an embodiment of the present invention.

Referring to FIG. 2, the photo thin film transistor includes a photoconductive layer 205 formed on a glass substrate 200. The glass substrate 200 is appropriate for a low temperature process substrate, and particularly, is appropriate for the fabrication of a device using light since it is transparent to light.

The photoconductive layer 205 is a GST layer including a chalcogenide element having excellent photoconductive efficiency. The photoconductive layer 205 is a photoconductive thin film absorbing light, to thereby generate optical current. The GST layer of the photoconductive layer 205 is capable of alternating between an amorphous structure and a crystal structure through the application of a laser beam or thermal energy, and is initially deposited as thin film having an amorphous structure in an embodiment of the present invention.

A source electrode 215 and a drain electrode 210 connected to the photoconductive layer 205 are formed on the glass substrate 200. The source electrode 215 and the drain electrode 210 are composed a metal, for example, gold or aluminum. The source electrode 215 and the drain electrode 210 function as an electrical path of an optical current generated by the photoconductive layer 205.

A gate insulating layer 220 is formed on the photoconductive layer 205. The gate insulating layer 220 is a chalcogenide insulating layer, for example, an $As_2S_3$ layer, or an organic poly methyl methcrylate (PMMA) layer.

The organic PMMA layer is transparent. The gate insulating layer 220 maintains a good contact with the photoconductive layer 205, and does not affect the fabrication properties of the GST layer.

A gate electrode 225 turns the optical current flowing through the photoconductive layer 205 on or off and is formed on the gate insulating layer 220. The gate electrode 225 may be formed of a metal, for example, gold or aluminum. The metal forming the gate electrode 225, or the source electrode 215 and the drain electrode 210 is not transparent in the present embodiment, but a transparent metal layer may be used.

FIG. 2 illustrates one photo thin film transistor. A plurality of the thin film transistors of FIG. 2 may be aligned in transverse and longitudinal directions in a plane to form a device. One photo thin film transistor of FIG. 2 may constitute a unit cell of an image sensor. A plurality of the unit cells of an image sensor of FIG. 2 may be aligned in transverse and longitudinal directions in a plane to form an image sensor absorbing light, turn the optical current on or off, and transfer light. Further, the photo thin film transistor of FIG. 2 can be an optical memory transistor capable of forming and storing an image.

Hereinafter, a photo thin film transistor that may be used as a unit cell of an image sensor according to another embodiment of the present invention will be described.

Figure 3:
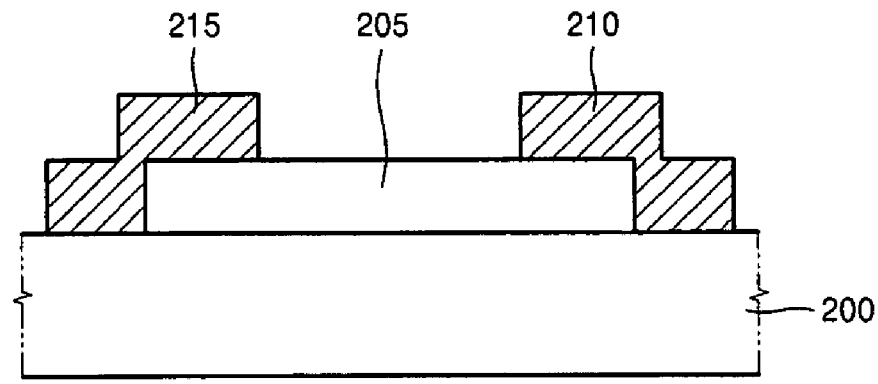
FIG. 3 is a cross-sectional view of a photo thin film transistor according to an embodiment of the present invention.
Figure 4:
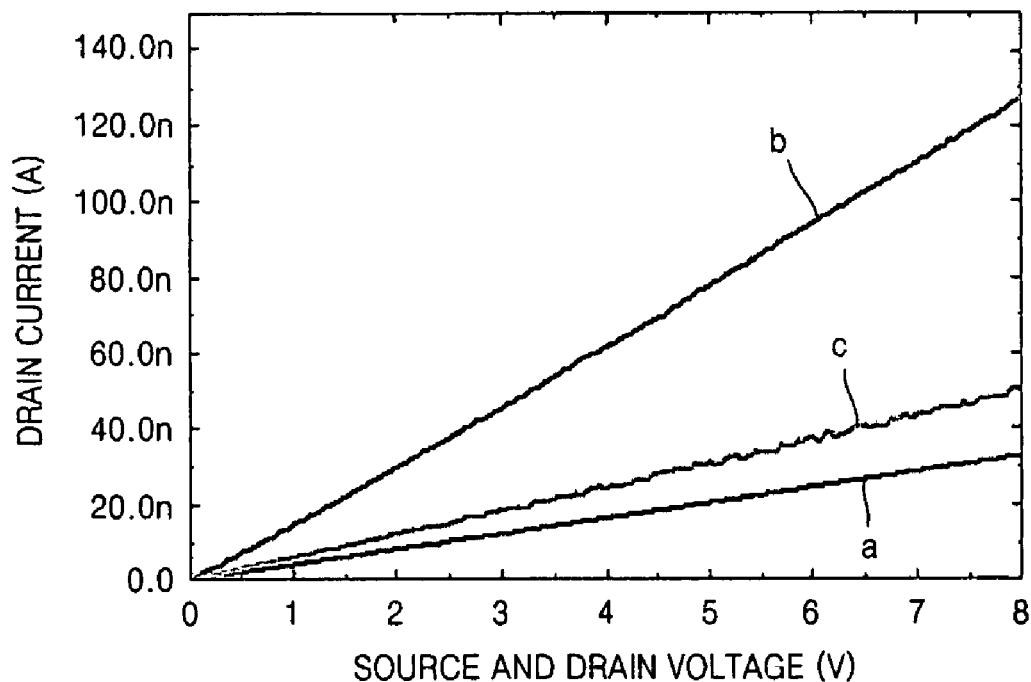
FIG. 4 is a graph of photoconductivity of the photo thin film transistor of FIG. 3.

FIG. 3 is a cross-sectional view of a photo thin film transistor according to an embodiment of the present invention. The photo thin film transistor of FIG. 3 does not include a gate electrode, and is used to simply measure photoconductivity. FIG. 4 is a graph of photoconductivity of the thin film transistor of FIG. 3. In FIGS. 2 and 3, like reference numerals refer to like elements.

Specifically, in FIG. 3, a photoconductive layer 205 formed of GST is formed on a glass substrate 200, and a source electrode 215 and a drain electrode 210 are formed on both sides of the photoconductive layer 205 to function as an electrical path for an optical current from the photoconductive layer 205. In the structure of FIG. 3, the gate electrode 225 of FIG. 1 is not formed. FIG. 4 illustrates the photoconductivity of the thin film transistor of FIG. 3.

In FIG. 4, the X-axis represents "a" source and drain voltage, and the Y-axis represents a drain current of nanoampere unit. In FIG. 4, graph "a" indicates the result of a case where the photoconductive layer 205 is formed of amorphous silicon, and graphs "b" and "c" indicate the results of cases where the photoconductive layer 205 is formed of GST. As illustrated in FIG. 4, when the photoconductive layer 205 is formed of GST, since a drain current is very high compared to the case where the photoconductive layer 205 is formed of amorphous silicon, photoconductivity is very high.

Figure 5:
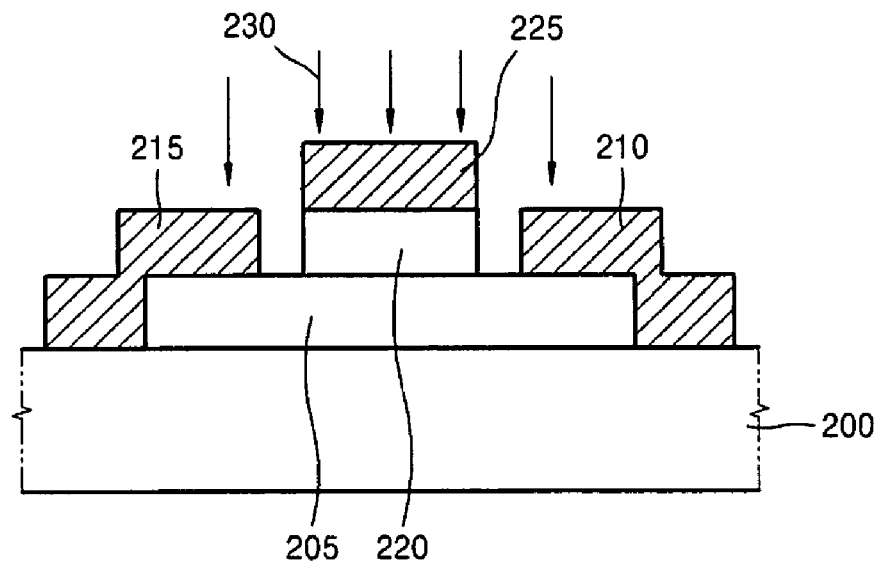
FIG. 5 is a cross-sectional view illustrating a process of measuring a photoconductivity of the photo thin film transistor of FIG. 2.
Figure 6:
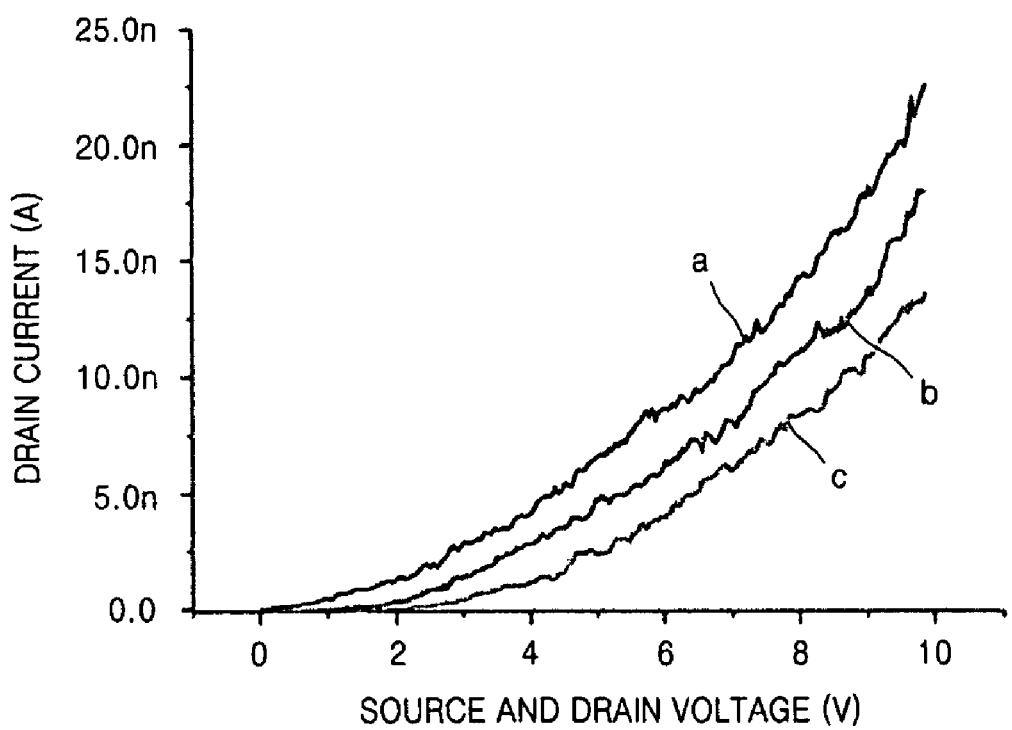
FIG. 6 is a graph of photoconductivity of the photo thin film transistor of FIG. 5.

FIG. 5 is a view illustrating a process of measuring the photoconductivity of the photo thin film transistor of FIG. 2, and FIG. 6 is a graph of the photoconductivity of the thin film transistor of FIG. 5. In FIGS. 5 and 2, like reference numerals refer to like elements. In FIG. 6, the X-axis represents a source and drain voltage, and the Y-axis represents a drain current of nanoampere unit.

Specifically, in FIG. 5, a photoconductive layer 205 form of GST is formed on a glass substrate 200, and a source electrode 215 and a drain electrode 210 forming an electrical path with the photoconductive layer 205 are formed on respective sides of the photoconductive layer 205. A gate insulating layer 220 and a gate electrode 225 are formed on the photoconductive layer 205. Visible rays 230 are radiated onto the structure of FIG. 5 in order to measure photoconductivity.

FIG. 6 illustrates current between the source electrode 215 and the drain electrode 210 according to a gate voltage applied to the photo thin film transistor on which the visible rays 230 (FIG. 5) are radiated.

While radiating the visible rays, for example, light with a wavelength of 632 nm, onto the structure of FIG. 5, current between the source electrode 215 and the drain electrode was measured while changing a gate voltage from 0 V to 2 V. In FIG. 6, graph "a" was obtained by applying 0 V to the gate electrode 225, graph "b" was obtained by applying 1 V to the gate electrode 225, and graph "c" was obtained by applying 2 V to the gate electrode 225.

In FIG. 6, since the voltage between the source electrode 215 and the drain electrode 210 varies according to the intensity of the incident light, its value is not fixed. Referring to FIG. 6, the drain current varied according to a variation in a reaction of the photoconductive layer 205 according to a change in the gate voltage.

As described above, the photo thin film transistor and the unit cell of the image sensor using the same according to the present invention include a GST layer having a chalcogenide element in an amorphous state as a photoconductive layer, thereby providing very high photoconductivity.

The photo thin film transistor and the unit cell of the image sensor using the same according to the present invention can be formed through a low temperature process relative to a typical CMOS fabrication process, and can be realized with low production costs since an ion implantation process is not necessary and a low-priced glass substrate can be employed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A photo thin film transistor comprising:
   a glass substrate;
   a photoconductive layer that is formed of GST (Ge—Sb—Te) including a chalcogenide element, is disposed on the glass substrate, and absorbs light and generates an optical current;
   a source electrode and a drain electrode that are formed on respective sides of the photoconductive layer and form a path for the optical current generated by the photoconductive layer;
   a gate insulating layer comprising a chalcogenide insulating layer formed on the photoconductive layer; and
   a gate electrode that is formed on the gate insulating layer and turns the optical current on or off.

2. The photo thin film transistor of claim 1, wherein the GST is amorphous.

3. A unit cell of an image sensor comprising:
   a glass substrate;
   a photoconductive layer that is formed of GST (Ge—Sb—Te) including a chalcogenide element, is disposed on the glass substrate, and absorbs light and generates an optical current;
   a source electrode and a drain electrode that are formed on respective sides of the photoconductive layer and form a path for the optical current generated by the photoconductive layer;
   a gate insulating layer comprising a chalcogenide insulating layer formed on the photoconductive layer; and
   a gate electrode that is formed on the gate insulating layer and turns the optical current on or off.

4. The unit cell of the image sensor of claim 3, wherein the GST is amorphous.

* * * * *